(12) United States Patent
Kose et al.

(10) Patent No.: US 9,007,140 B1
(45) Date of Patent: Apr. 14, 2015

(54) DIGITALLY CONTROLLED WIDE RANGE PULSE WIDTH MODULATOR

(71) Applicants: Selcuk Kose, Tampa, FL (US); Eby G. Friedman, Rochester, NY (US)

(72) Inventors: Selcuk Kose, Tampa, FL (US); Eby G. Friedman, Rochester, NY (US)

(73) Assignees: University of South Florida, Tampa, FL (US); University of Rochester, Rochester, NY (US)

( * ) Notice: Subject to any disclaimer, the term of this patent is extended or adjusted under 35 U.S.C. 154(b) by 0 days.

(21) Appl. No.: 14/150,434

(22) Filed: Jan. 8, 2014

Related U.S. Application Data

(60) Provisional application No. 61/750,072, filed on Jan. 8, 2013.

(51) Int. Cl.
*H03K 7/08* (2006.01)
(52) U.S. Cl.
CPC ........................................ *H03K 7/08* (2013.01)
(58) Field of Classification Search
USPC .................................... 332/109; 331/57, 185
See application file for complete search history.

(56) References Cited

U.S. PATENT DOCUMENTS

| | | | | |
|---|---|---|---|---|
| 7,015,766 | B1* | 3/2006 | Guo et al. | 331/176 |
| 7,154,352 | B2* | 12/2006 | Smith et al. | 331/185 |
| 7,239,115 | B2 | 7/2007 | Chapuis et al. | |
| 7,965,145 | B2* | 6/2011 | Kim et al. | 331/57 |
| 7,977,994 | B2 | 7/2011 | Yousefzadeh et al. | |

FOREIGN PATENT DOCUMENTS

EP        0338798 B1     7/1994

OTHER PUBLICATIONS

Razavi. Design of Analog CMOS Integrated Circuits. New York: McGraw-Hill, 2001.
Calhoun and Chandrakasan. Ultra-dynamic Voltage Scaling Using Sub-Threshold Operation and Local Voltage Dithering in 90nm CMOS. Proceedings of the IEEE International Solid-State Circuits Conference. 2006. vol. 41 (No. 1): 300-599.
T.D. Burd et al., A Dynamic Voltage Scaled Microprocessor System. IEEE Journal of Solid-State Circuits. 2000. vol. 35 (No. 11): 1571-1580.
Docking and Sachdev. A Method to Derive an Equation for the Oscillation Frequency of a Ring Oscillator. IEEE Transactions on Circuits and Systems I: Fundamental Theory and applications. 2003. vol. 50 (No. 2): 259-264.
Djemouai et al., High Performance Integrated Cmos Frequency to Voltage Converter. Proceedings of the Tenth International Conference on Microelectronics. 1998: 63-66.

(Continued)

*Primary Examiner* — Joseph Chang
(74) *Attorney, Agent, or Firm* — Molly Sauter; Smith & Hopen, P.A.

(57) ABSTRACT

The present invention provides a digitally controlled, current starved, pulse width modulator (PWM). In the PWM of the present invention, the amount of current from the voltage source to the ring oscillator is controlled by the proposed header circuit. By changing the header current, the pulse width of the switching signal generated at the output of the ring oscillator is dynamically controlled, where the duty cycle can vary between 50% and 90%. A duty cycle to voltage converter is used to ensure the accuracy of the system under process, voltage, and temperature (PVT) variations. The proposed pulse width modulator is appropriate for dynamic voltage scaling systems due to the small on-chip area and high accuracy under process, voltage, and temperature variations.

20 Claims, 7 Drawing Sheets

(56) References Cited

OTHER PUBLICATIONS

Pappu et al., Process-Invariant Current Source Design: Methodology and Examples. IEEE Journal of Solid-State Circuits. 2007. vol. 42 (No. 10): 2293-2302.

Zhang and Apsel. A Low-Power, Process and Temperature Compensated Ring Oscillator with Addition Based Current Source. IEEE Transactions on Circuits and Systems I: Regular Papers. 2011.vol. 58 (No. 5): 868-878.

NIMO Group. Predictive Technology Model (PTM). Date Accessed Mar. 3, 2014. http://www.eas.asu.edu/~ptm.

* cited by examiner

DIGITALLY CONTROLLED WIDE RANGE PULSE WIDTH MODULATOR

CROSS-REFERENCE TO RELATED APPLICATIONS

This application claims priority to U.S. Provisional Patent Application No. 61/750,072, entitled "DIGITALLY CONTROLLED WIDE RANGE PULSE WIDTH MODULATOR," filed on Jan. 8, 2013, the contents of which are hereby incorporated by reference.

STATEMENT OF GOVERNMENT INTEREST

This invention was made with Government support under Grant No. CCF-0811317 awarded by the National Science Foundation (NSF). The Government has certain rights in the invention.

BACKGROUND OF THE INVENTION

Voltage controlled oscillators (VCOs) are widely used to generate a switching signal where some of the characteristics of the generated signal can also be controlled. Two types of VCOs are primarily used in high performance integrated circuits (ICs); inductor-capacitor (LC) oscillators and ring oscillators. LC oscillators can operate at very high frequencies and exhibit superior noise performance. Alternatively, ring oscillators occupy significantly smaller on-chip area and have a wider tuning range. Due to these advantages, ring oscillators have found widespread utilization in modern ICs.

A conventional ring oscillator consists of an odd number of inverters, wherein the output of the last inverter is fed back to the input of the first inverter. The delay provided by each inverter in the chain of inverters provides a phase shift to the switching signal. The sum of these individual delays (i.e., phase shifts) and the feedback from the last to the first inverter provides a phase shift of $2\pi$, resulting in an oscillation. The frequency of this oscillation therefore depends upon the sum of the inverter delays within the chain.

The duty cycle of the generated switching signal is typically 50% for conventional ring oscillators when the PMOS (p-type metal-oxide semiconductor) and NMOS (n-type metal-oxide semiconductor) transistors within the inverters provide the same rise and fall transition slopes. The duty cycle of a ring oscillator can be changed by controlling the transition time of the inverters within the ring oscillator. Header and footer circuits are widely used to control the amount of current supplied to the PMOS and NMOS transistors within the ring oscillator inverter chain. It is desirable to be able to dynamically change the duty cycle of the ring oscillator, thereby providing a dynamically changing input switching signal to an on-chip voltage regulator. However, the header and foot circuits currently known in the art do not provide a means for dynamically changing the duty cycle of the pulse width modulator.

Accordingly, what is needed in the art is a pulse width modulator that provides a means for dynamic voltage scaling that can dynamically change the duty cycle of the input switching signal for on-chip voltage regulators. It is desirable to have a pulse width modulator that will enable high granularity dynamic voltage scaling (DVS) at runtime and substantially reduce the reaction time from milliseconds to nanoseconds.

SUMMARY OF INVENTION

The present invention provides a digitally controlled pulse width modulator (PWM) which comprises a header circuit, a ring oscillator, and a duty cycle to voltage (DC2V) converter. The header circuit of the present invention controls the amount of current delivered to the PMOS transistors within the ring oscillator. Since the target specification is to vary the duty cycle between 50% and 90%, no footer circuitry is used to control the current of the NMOS transistors. Contrary to the conventional header circuits, where the header is connected to all of the inverters within the ring oscillator chain, the proposed header circuit is connected to every other inverter stage to improve the dynamic range of the duty cycle. This header circuit provides high granularity duty cycle control which has a step size of 2% of the period. Additionally, a DC2V converter, which is based on a frequency to voltage converter, is utilized to maintain the accuracy of the PWM under process, voltage, and temperature (PVT) variations. Under PVT variations, the maximum change in the duty cycle is less than 1.5% of the period.

In one embodiment, a pulse width modulator includes a ring oscillator comprising an odd plurality of delay stage inverters coupled in a sequential loop and a header circuit coupled between a power source and every other delay stage inverter of the odd plurality of delay stage inverters, every other delay stage inverter including the first delay stage inverter and the last delay stage inverter of the sequential loop, the header circuit configured to control a current flow from a power source to every other delay stage inverter of the ring oscillator.

In a particular embodiment, the header circuit further includes a first transistor having a gate node coupled to an analog control signal, a source node coupled to the power source and a drain node coupled to the ring oscillator, a second transistor having a gate coupled to the analog control signal, a source node coupled to the power source and a drain node coupled to a ground node, through a resistor and a third transistor having a gate node coupled to the ground node, through a resistor, a source node coupled to the power source and a drain node coupled to the ring oscillator.

In an additional embodiment, the third transistor further includes a plurality of parallel transistors, each of the plurality of parallel transistors having a switch transistor coupled between the drain node and the ring oscillator.

The pulse width modulator further includes a duty cycle to voltage (DC2V) converter coupled between an output of the ring oscillator and the header circuit, the DC2V converter to provide an analog control signal to an input of the header circuit, the analog control signal to control a current flow from the header to the ring oscillator.

In operation of the invention, a method of pulse width modulation is provided by controlling a current flow from a power source to every other delay stage inverter of a ring oscillator to change a transition slope of an input signal to generate an output signal having a modified duty cycle and by regulating the transition slope of the output signal from every other delay stage inverter of the ring oscillator.

As a result of the small on-chip area of the circuitry, fast control circuitry, high accuracy under PVT variations, and dynamic duty cycle control, the proposed pulse width modulator can dynamically change the duty cycle of the input switching signal for on-chip voltage regulators. The PWM circuitry will enable high granularity dynamic voltage scaling (DVS) at runtime and substantially reduce the reaction time from milliseconds to nanoseconds.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
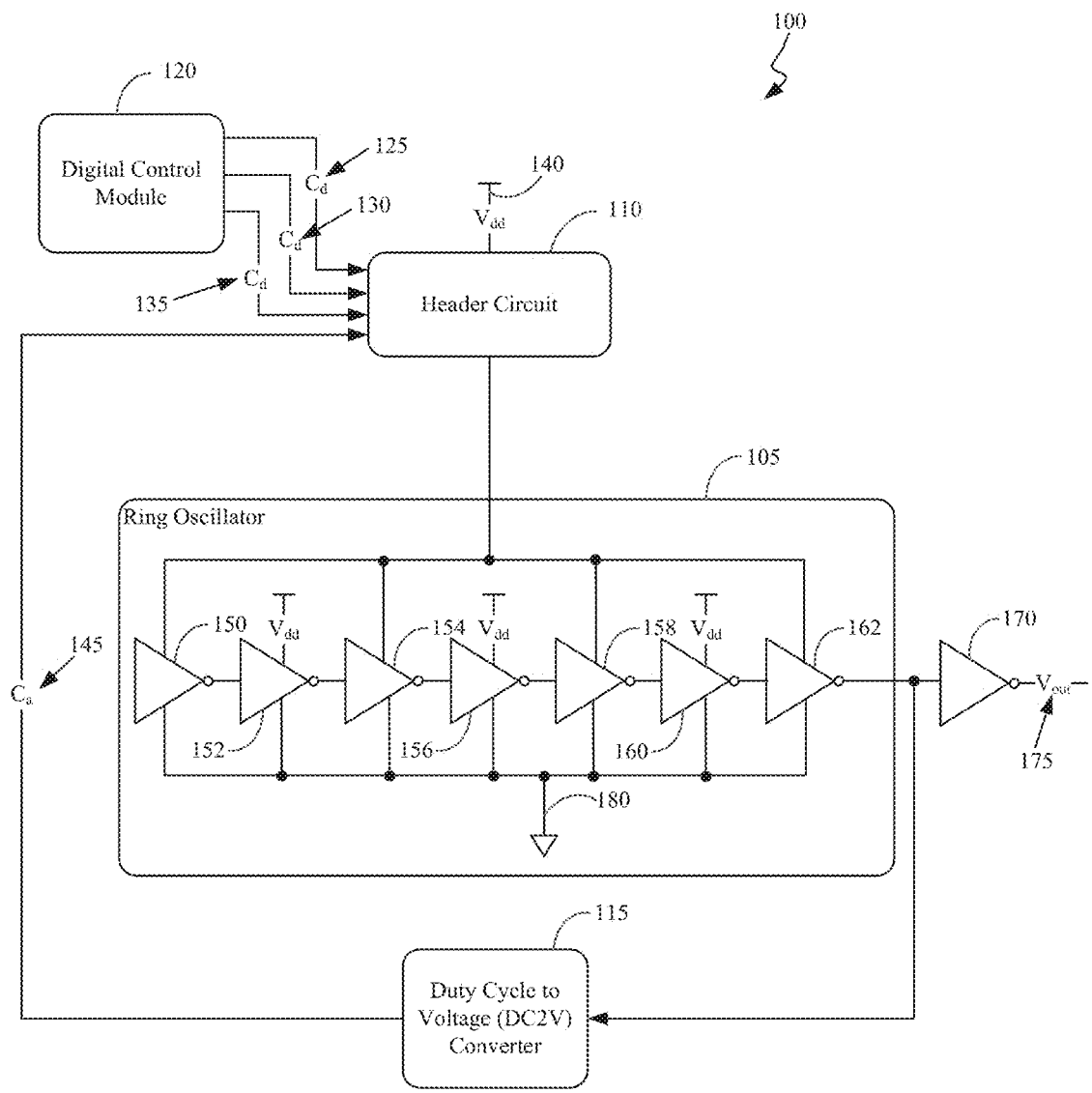
FIG. 1 is a block diagram of the pulse width modulator in accordance with an embodiment of the invention.

A diagram of a pulse width modulator 100 in accordance with an embodiment of the present invention is shown with reference to FIG. 1. In this particular embodiment, the pulse width modulator 100 utilizes a seven-stage ring oscillator 105. However, it is within the scope of the present invention to utilize a ring oscillator comprising a different number of stages.

In the embodiment of FIG. 1, the inverters are connected in a sequential loop to form the ring oscillator 105. In this embodiment, the first 150, third 154, fifth 158, and seventh 162 stages of the ring oscillator 105 are connected to the header circuit 110 and the inverters in the second 152, fourth 156 and sixth 160 stages of the ring oscillator 105 are connected directly to $V_{dd}$ 140. Each of the inverter stages have a second input coupled to a ground node 180. In a ring oscillator, the inverters at every other stage generate the same logic function with a phase shift. By having the header circuit 110 connected to every other stage of the ring oscillator, the charging time of the output nodes of these stages 150, 154, 158 and 162 are effectively increased. The inverters 152, 156 and 160 which are not connected to the header 110, regulate the transition slopes of the signal generated by stages 150, 154, 158 and 162, which have a modified duty cycle.

The pulse width modulator 100 of FIG. 1 further includes a digital control module 120 coupled to the header circuit 110. The digital control module 120 provides one or more digital control signals 125, 130, 135 to the header circuit 110. The digital control signals 125, 130, 135 are used to dynamically change the individual transistors of the header circuit to provide a high granularity duty cycle control. The pulse width modulator 100 further includes a duty cycle to voltage (DC2V) converter 115 coupled between the output of the ring oscillator 105 and the header circuit 110. The duty cycle to voltage converter 115 provides an analog control signal 145 that is utilized to maintain a constant current flow from the header circuit 110 to the ring oscillator 105 under process, voltage and temperature (PVT) variations. The pulse width modulator 100 further includes an output inverter 170 coupled to the output of the ring oscillator 105, the output inverter 170 to provide an output voltage 175 from the pulse width modulator 100.

Figure 2:
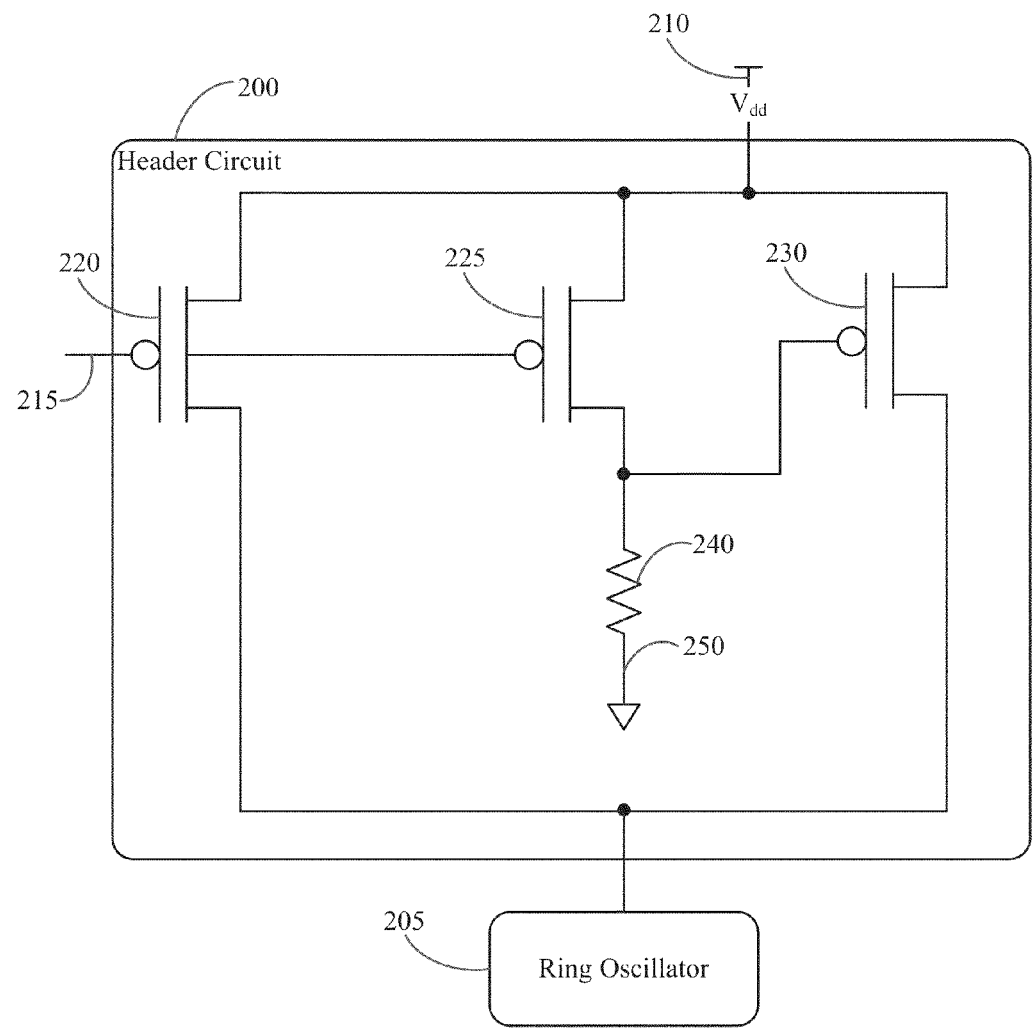
FIG. 2 is a schematic diagram of an addition based current source utilized as a header circuit in accordance with an embodiment of the invention.

A diagram illustrating a header circuit 200 of the pulse width modulator in accordance with an embodiment of the present invention is shown with reference to FIG. 2. As shown, the header circuit 200 is coupled to the ring oscillator 205 to current starve every other stage in the ring oscillator 205 inverter chain. The header circuit 200 includes two input control signals, a digital control signal ($C_d$) from a digital control module and an analog control signal ($C_a$) from a duty cycle to voltage converter, as previously described with reference to FIG. 1. The digital control signal $C_d$ is to used to dynamically change the individual transistors to provide a high granularity duty cycle control, whereas the analog control signal $C_a$ is utilized to maintain a constant current flow from the header 200 to the ring oscillator 205 under process, voltage and temperature (PVT) variations. The digital control module may provide multiple digital control ($C_d$) signals to dynamically change the duty cycle and the duty cycle to voltage (DC2V) converter ensures the accuracy of the duty cycle by providing an analog control signal ($C_a$) to the header circuit 110 under process, voltage and temperature (PVT) variations.

In a specific embodiment, an addition-based current source, as shown in FIG. 2, is used as the header circuit 200 to compensate for temperature and process variations by keeping the total current constant. In this specific embodiment, the header circuit 200 includes one common input voltage 215 that controls the gate voltage of two transistors 220, 225. The source nodes of the transistors 220, 225 are coupled to the source voltage 210. The drain node of the first transistor 220 is coupled to the ring oscillator and the drain node of the second transistor 225 is coupled to a ground node 250, through a resistor 240. The drain node of the second transistor 225 is additionally coupled to the gate node of a third transistor 230. The source node of the third transistor 230 is coupled to the source voltage 210 and the drain node of the third transistor 230 is coupled to the ring oscillator 205. By controlling the gate voltage of transistor 220 and 225, the sum of the current delivered to the ring oscillator 205 is kept constant for a wide range of temperature and process variations.

Figure 3:
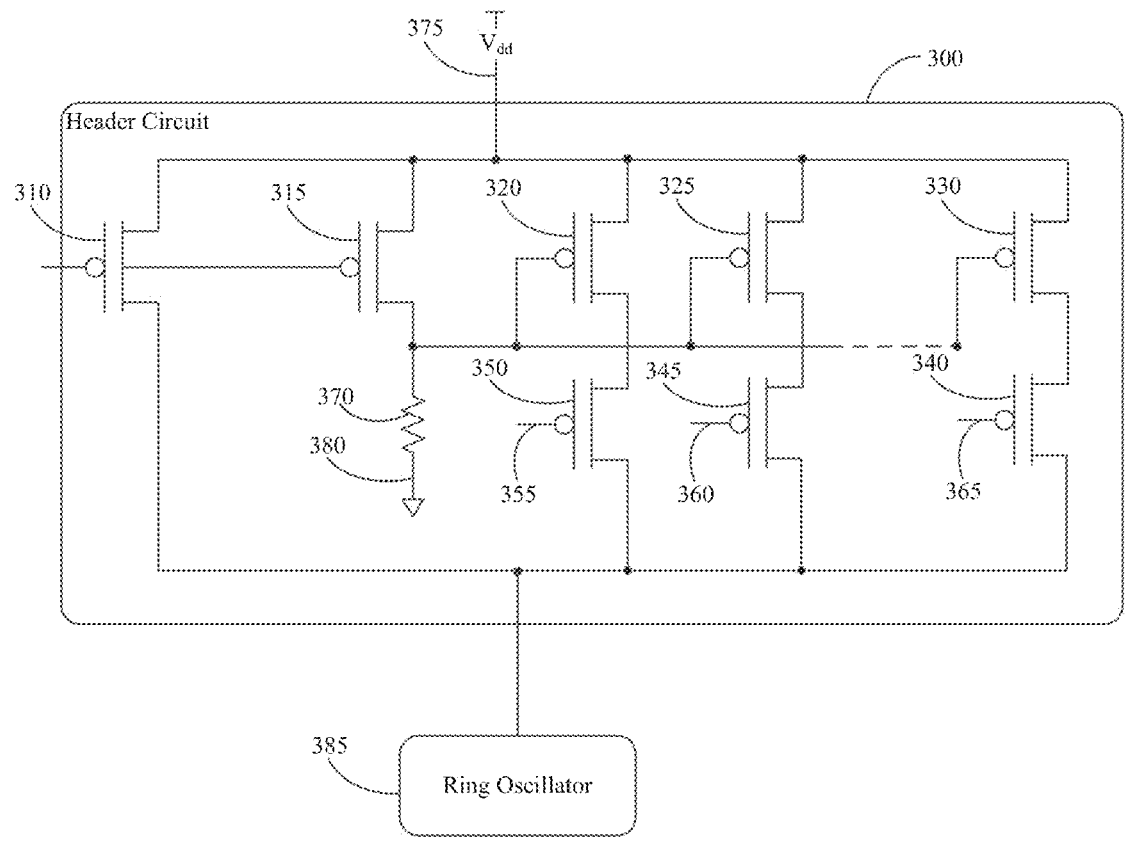
FIG. 3 is a schematic diagram illustrating additional switching transistors to turn on and turn off different sections of the header circuit in accordance with an embodiment of the present invention.

In an additional embodiment of the present invention an additional embodiment of the header circuit 300 is illustrated with reference to FIG. 3. In this embodiment, the duty cycle of the ring oscillator 385 output is controlled by changing the transition time of the PMOS transistors at every other inverter stage within the ring oscillator 385. In this embodiment, instead of having a single transistor whose gate is connected to the resistor as in transistor 230 of FIG. 2, multiple PMOS transistors are added in parallel in place of transistor 230 in the proposed header circuit 300. As shown in FIG. 3, the first transistor 310 and the second transistor 315 have a gate node coupled to a common input signal. Transistors 310 and 315 have a source node coupled to the source voltage 375. The drain node of transistor 310 is coupled to the ring oscillator 385 and the drain node of transistor 315 is coupled to a ground node 380 through a resistor 370. The gate nodes of transistors 320, 325 and 330 are coupled to the ground node 380 through the resistor 370 and the source nodes of transistors 320, 325 and 330 are coupled to the voltage source 375. Additionally, each of the drain nodes of transistors 320, 325 and 330 are coupled to a corresponding switching transistor 340, 345, 350. The drain nodes of the switching transistors are coupled to the ring oscillator 385. The gate nodes of each of the switching transistors 340, 345 and 350 are coupled to one of the digital control signals 355, 360, 365 generated by the digital control module 120 as shown with reference to FIG. 1. As such, all of the transistors 320, 325 and 330 have approximately the same gate to source voltage, but the voltage at the drain nodes are controlled by the additional switch transistors 340, 345, 350. The gate voltage of these switching transistors is controlled by the corresponding digital control signal 355, 360, 365 from the digital control module 120 to turn on and turn off individual header stages. Turning all the header stages to an on state allows maximum current to the ring oscillator, thereby minimizing the duty cycle of the ring oscillator 385. In a particular embodiment, the first two transistors 310, 315 in the header circuit 300 are comparably large relative to the other transistors in the header circuit 300 to minimize the mismatch. In a specific embodiment, a minimum channel length of 150 nm is used for the two first input transistors 310, 315 as opposed to a 40 nm channel length for the remainder of the transistors.

Figure 4:
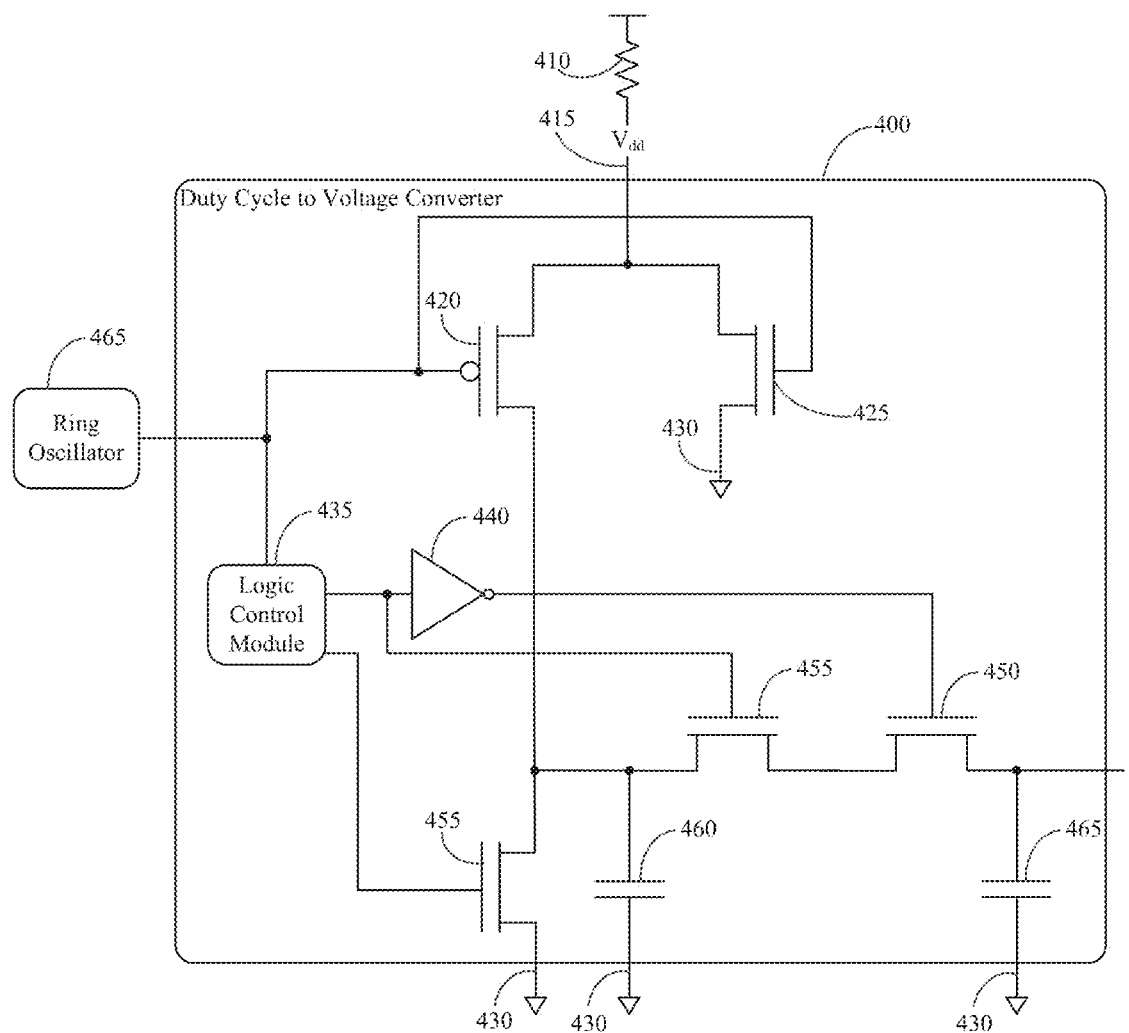
FIG. 4 is a schematic diagram illustrating a frequency to voltage converter utilized as a duty cycle to voltage converter in accordance with an embodiment of the invention.

In a particular embodiment, a frequency to voltage converter is utilized as a duty cycle to voltage (DC2V) converter in the pulse width modulator (PWM) of the present invent. A circuit schematic of this DC2V converter 400 is shown with reference to FIG. 4. In this embodiment, there are primarily three different phases of the DC2V circuit. During the first phase, a first capacitor 460 is charged through a first transistor 420. The first transistor 420 has a gate node coupled to an input switching signal from the ring oscillator 465, a source node coupled to a source voltage 415 through a resistor 410 and a drain node coupled to the source node of a second transistor 455. A fourth transistor 425 has a source node coupled to the source node of the first transistor 420, a gate node coupled to the input switching signal from the rings oscillator 465 and a drain node coupled to a ground node 430. In one embodiment, the first transistor 420 is a PMOS transistor and the fourth transistor 425 is an NMOS transistor. The DC2V converter 400 further includes a logic control module 435 having an input coupled to the input switching signal of the ring oscillator 465, a first output coupled to the gate node of a fifth transistor 455 and a second output coupled to an input of an inverter 440 and to the gate node of a second transistor 457. The output of the inverter 440 is coupled to the gate of a third transistor 450. In the second phase, the second transistor (i.e., switch) 457 and the third transistor 450 are turned on to allow charge sharing between the first capacitor 460 and a second capacitor 465. In the third phase, the first capacitor 460 is discharged through the second transistor 455. The charging time of the first capacitor 460 depends on the duty cycle of the input switching signal from the ring oscillator 465. A signal with a greater duty cycle causes more charge accumulation on the first capacitor 460, thereby increasing the output voltage of the DC2V converter.

Figure 5:
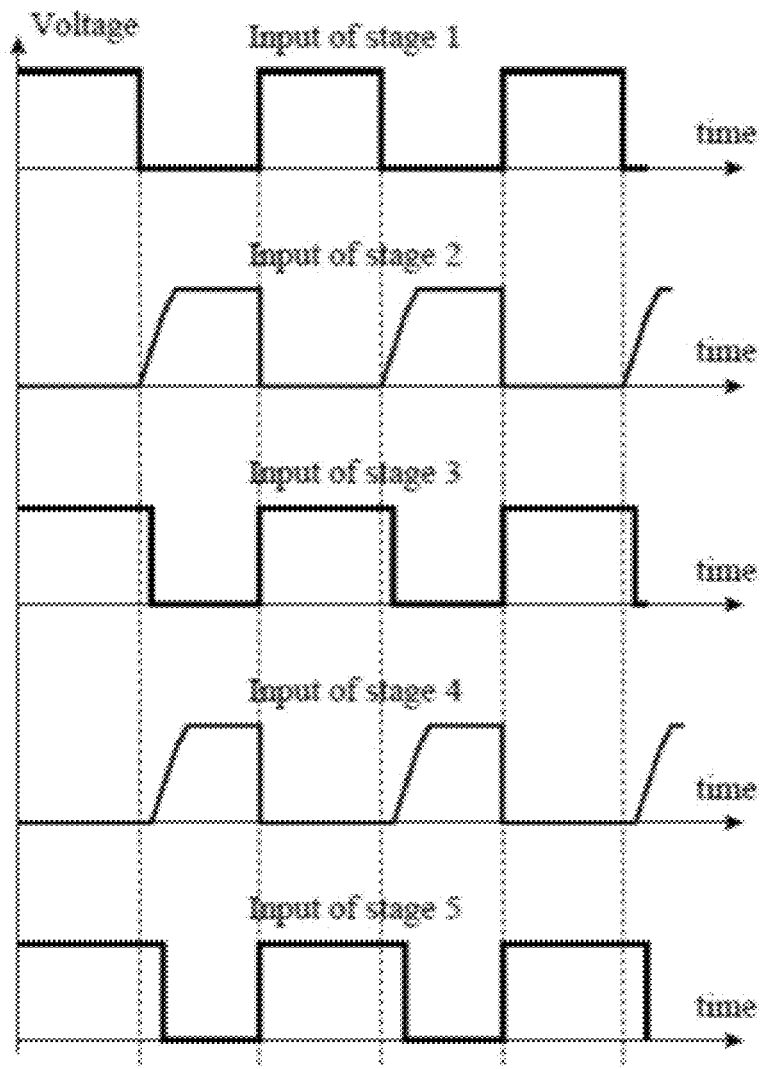
FIG. 5 is a timing diagram illustration of the ring oscillator in accordance with an embodiment of the invention.

A timing diagram for an exemplary five stage ring oscillator in accordance with the present invention is shown with reference to FIG. 5. In the timing diagram of FIG. 5, it is shown that each stage connected to the header circuit 110 changes the transition slope of the input signal and each stage directly connected to the supply voltage $V_{dd}$ 140 regulates the transition slope of the signal from the previous stage.

In an exemplary embodiment, the proposed pulse width modulator was designed and implemented using the 22 nm CMOS predictive technology model (PTM). Some of the related parameters in the technology model file were modified to include process corners such as typical-typical (TT), slow-slow (SS) and fast-fast (FF) to the circuit simulation.

Figure 6:
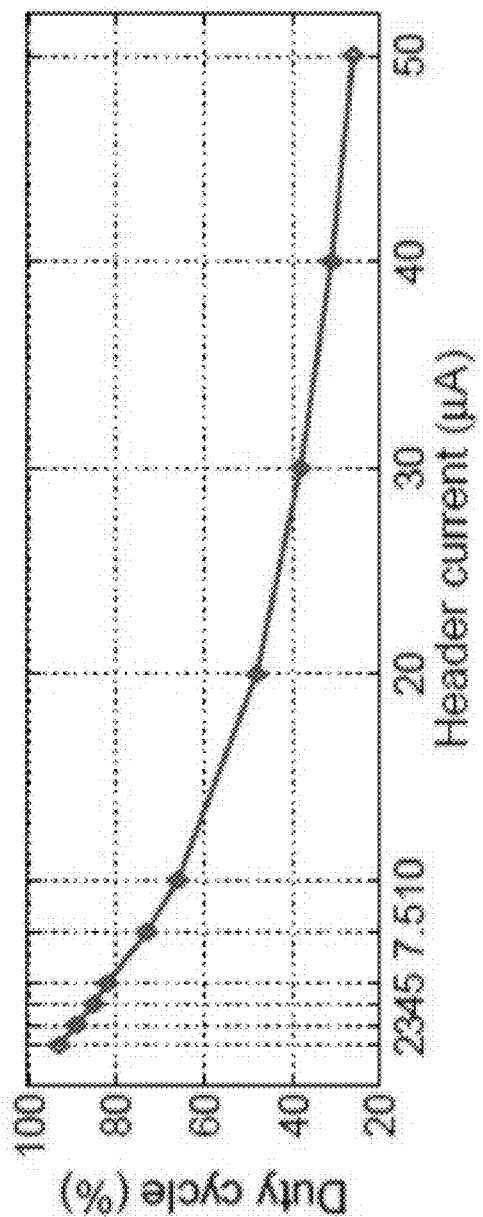
FIG. 6 is a graphical illustration of the variation in the duty cycle in response to a change in the header current in accordance with an embodiment of the invention.

For the simulation results of the proposed circuit, first, the effect of the current, which is provided by the header circuit to the ring oscillator on the duty cycle of the ring oscillator output is analyzed by using an ideal current source in place of the header circuit. When the current from the header circuit changes from 2 μA to 50 μA, the duty cycle of the switching signal at the output of the ring oscillator changes from 93% to 25%. Although the relationship between the amount of header current and the duty cycle is not linear, as shown in FIG. 6, this relationship can be easily controlled by the digital control module.

Figure 7:
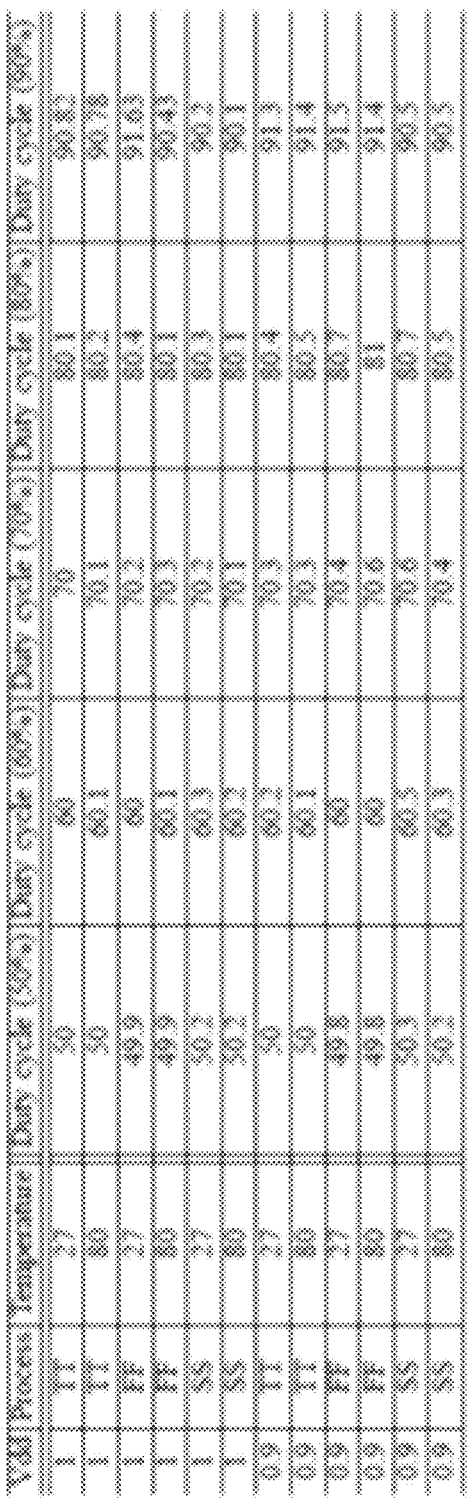
FIG. 7 is a table illustrating the duty cycle of the proposed PWM under various PVT variations in accordance with an embodiment of the invention.

The accuracy of the proposed PWM was also analyzed for different duty cycle ratios under PVT variations. The percent deviation of different duty cycle ratios is listed in the table of FIG. 7, when the supply voltage varies ±5% from the nominal 0.95 volts and the temperature varies from 27° C. to 80° C. The simulations have been performed for TT, SS, and FF process corners. The deviation of the duty cycle under the PVT variations is less than 1.5% of the total period of the switching signal. A transistor with a narrower gate width is more sensitive to PVT variations than a wider gate width transistor. Narrower transistors are turned on within the header circuitry when generating a greater duty cycle switching signal. The effect of PVT variations is therefore more prominent on the signals with a greater duty cycle in the proposed system. This trend can be observed in the table wherein the deviation for signals with 50% duty cycle is smaller than for the signals with 90% duty cycle.

In accordance with the present invention, a digitally controlled PWM with a wide pulse width range of 50% to 90% is provided. An addition based header circuit is proposed to provide a greater range of header current. In the present invention, the proposed header circuit is connected to every other stage of the ring oscillator to significantly improve the dynamic range of the pulse width of the output signal. A DC2V converter samples the duty cycle of the output signal and generates an analog voltage to control the header current. The PVT variations are compensated by the feedback loop generated by this DC2V converter. Under PVT variations, the deviations in the pulse width are less than 1.5% of the switching signal period. The proposed pulse width modulator provides a means for dynamic voltage scaling systems due to the fast control circuitry, high accuracy under PVT variations, and dynamic duty cycle control It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:
1. A pulse width modulator, comprising:
 a ring oscillator comprising an odd plurality of delay stage inverters coupled in a sequential loop; and
 a header circuit coupled between a power source and every other delay stage inverter of the odd plurality of delay stage inverters, every other delay stage inverter including the first delay stage inverter and the last delay stage inverter of the sequential loop, the header circuit configured to control a current flow from a power source to every other delay stage inverter of the ring oscillator.
2. The pulse width modulator of claim 1, wherein the power source is coupled to the delay stage inverters that are not coupled to the header circuit.
3. The pulse width modulator of claim 1, wherein the header circuit is an addition-based current source.

4. The pulse width modulator of claim 1, wherein the header circuit further comprises circuitry configured to compensate for process, voltage and temperature (PVT) variations.

5. The pulse width modulator of claim 1, wherein the header circuit further comprises:
   a first transistor having a gate node coupled to an analog control signal, a source node coupled to the power source and a drain node coupled to the ring oscillator;
   a second transistor having a gate coupled to the analog control signal, a source node coupled to the power source and a drain node coupled to a ground node, through a resistor; and
   a third transistor having a gate node coupled to the ground node, through a resistor, a source node coupled to the power source and a drain node coupled to the ring oscillator.

6. The pulse width modulator of claim 5, wherein the third transistor further comprises a plurality of parallel transistors, each of the plurality of parallel transistors having a switch transistor coupled between the drain node and the ring oscillator.

7. The pulse width modulator of claim 1, further comprising a duty cycle to voltage (DC2V) converter coupled between an output of the ring oscillator and the header circuit, the DC2V converter to provide an analog control signal to an input of the header circuit, the analog control signal to control a current flow from the header to the ring oscillator.

8. The pulse width modulator of claim 6, wherein the duty cycle to voltage (DC2V) converter further comprises:
   a first phase circuit configured to charge a first capacitor,
   a second phase circuit configured to allow charge sharing between the first capacitor and a second capacitor; and
   a third phase circuit configured to discharge the first capacitor.

9. The pulse width modulator of claim 1, further comprising a digital control module coupled to the header circuit, the digital control module to provide a digital control signal to an input of the header circuit, the digital control signal to control the duty cycle of the ring oscillator.

10. A pulse width modulator, comprising:
    a ring oscillator comprising an odd plurality of delay stage inverters coupled in a sequential loop;
    a header circuit coupled between a power source and every other delay stage inverter of the odd plurality of delay stage inverters, every other delay stage inverter including the first delay stage inverter and the last delay stage inverter of the sequential loop, the header circuit configured to control a current flow from a power source to every other delay stage inverter of the ring oscillator; and
    a duty cycle to voltage (DC2V) converter coupled between an output of the ring oscillator and the header circuit, the DC2V converter to provide an analog control signal to an input of the header circuit, the analog control signal to control a current flow from the header to the ring oscillator.

11. The pulse width modulator of claim 10, further comprising a digital control module coupled to the header circuit, the digital control module to provide a digital control signal to an input of the header circuit, the digital control signal to control the duty cycle of the ring oscillator.

12. The pulse width modulator of claim 10, wherein the power source is coupled to the delay stage inverters that are not coupled to the header circuit.

13. The pulse width modulator of claim 10, wherein the header circuit is an addition-based current source.

14. The pulse width modulator of claim 10, wherein the header circuit further comprises circuitry configured to compensate for process, voltage and temperature (PVT) variations.

15. The pulse width modulator of claim 10, wherein the header circuit further comprises:
    a first transistor having a gate node coupled to an analog control signal, a source node coupled to the power source and a drain node coupled to the ring oscillator,
    a second transistor having a gate coupled to the analog control signal, a source node coupled to the power source and a drain node coupled to a ground node, through a resistor; and
    a third transistor having a gate node coupled to the ground node, through a resistor, a source node coupled to the power source and a drain node coupled to the ring oscillator.

16. The pulse width modulator of claim 15, wherein the third transistor further comprises a plurality of parallel transistors, each of the plurality of parallel transistors having a switch transistor coupled between the drain node and the ring oscillator.

17. The pulse width modulator of claim 10, wherein the duty cycle to voltage (DC2V) converter further comprises:
    a first phase circuit configured to charge a first capacitor,
    a second phase circuit configured to allow charge sharing between the first capacitor and a second capacitor; and
    a third phase circuit configured to discharge the first capacitor.

18. A method of pulse width modulation, the method comprising:
    controlling a current flow from a power source to every other delay stage inverter of a ring oscillator to change a transition slope of an input signal to generate an output signal having a modified duty cycle, the ring oscillator comprising an odd plurality of delay stage inverters coupled in a sequential loop; and
    regulating the transition slope of the output signal from every other delay stage inverter of the ring oscillator.

19. The method of claim 18, further comprising providing an analog control signal to control a current flow from the power source to the ring oscillator.

20. The method of claim 18, further comprising providing a digital control signal to control the duty cycle of the output signal generated by every other delay stage inverter off the ring oscillator.

* * * * *